United States Patent
Faruqui et al.

(10) Patent No.: US 9,859,248 B2
(45) Date of Patent: Jan. 2, 2018

(54) LASER DIE BACKSIDE FILM REMOVAL FOR INTEGRATED CIRCUIT (IC) PACKAGING

(71) Applicant: INTEL CORPORATION, Santa Clara, CA (US)

(72) Inventors: Danish Faruqui, Chandler, AZ (US); Edward R. Prack, Phoenix, AZ (US); Sergei L. Voronov, Chandler, AZ (US); David K. Wilkinson, Jr., Scottsdale, AZ (US); Tony Dambrauskas, Chandler, AZ (US); Lars D. Skoglund, Chandler, AZ (US); Yoshihiro Tomita, Tsukuba (JP); Mihir A. Oka, Chandler, AZ (US); Rajen C. Dias, Phoenix, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/196,866

(22) Filed: Jun. 29, 2016

(65) Prior Publication Data

US 2016/0307869 A1    Oct. 20, 2016

Related U.S. Application Data

(62) Division of application No. 13/830,126, filed on Mar. 14, 2013, now Pat. No. 9,412,702.

(51) Int. Cl.
*H01L 23/00* (2006.01)
*H01L 23/538* (2006.01)
(Continued)

(52) U.S. Cl.
CPC ............ *H01L 24/83* (2013.01); *H01L 21/56* (2013.01); *H01L 21/76898* (2013.01);
(Continued)

(58) Field of Classification Search
CPC ............... H01L 21/56; H01L 21/76898; H01L 23/49816; H01L 23/5389; H01L 23/544;
(Continued)

(56) References Cited

U.S. PATENT DOCUMENTS 4,448,636 A   5/1984 Baber
5,597,590 A   1/1997 Tanimoto et al.
(Continued)

OTHER PUBLICATIONS

Kübler, C. et al., "Coherent Structural Dynamics and Electronic Correlations during an Ultrafast Insulator-to-Metal Phase Transition in VO2," Phys Rev Lett. Sep. 2007 14:99(11):116401. Epub Sep. 13, 2007.

(Continued)

*Primary Examiner* — Shahed Ahmed
(74) *Attorney, Agent, or Firm* — Schwabe, Williamson & Wyatt, P.C.

(57) ABSTRACT

Embodiments of the present disclosure are directed to die adhesive films for integrated circuit (IC) packaging, as well as methods for forming and removing die adhesive films and package assemblies and systems incorporating such die adhesive films. A die adhesive film may be transparent to a first wavelength of light and photoreactive to a second wavelength of light. In some embodiments, the die adhesive film may be applied to a back or "inactive" side of a die, and the die surface may be detectable through the die adhesive film. The die adhesive film may be cured and/or marked with laser energy having the second wavelength of light. The die adhesive film may include a thermochromic dye and/or nanoparticles configured to provide laser mark contrast. UV laser energy may be used to remove the die adhesive film in order to expose underlying features such as TSV pads.

20 Claims, 7 Drawing Sheets

(51) Int. Cl.
*H01L 23/544* (2006.01)
*H01L 21/768* (2006.01)
*H01L 23/498* (2006.01)
*H01L 25/065* (2006.01)
*H01L 21/56* (2006.01)

(52) U.S. Cl.
CPC .... *H01L 23/49816* (2013.01); *H01L 23/5389* (2013.01); *H01L 23/544* (2013.01); *H01L 24/19* (2013.01); *H01L 24/29* (2013.01); *H01L 24/32* (2013.01); *H01L 24/75* (2013.01); *H01L 24/92* (2013.01); *H01L 25/0657* (2013.01); *H01L 21/568* (2013.01); *H01L 24/13* (2013.01); *H01L 24/16* (2013.01); *H01L 24/73* (2013.01); *H01L 24/81* (2013.01); *H01L 2223/54426* (2013.01); *H01L 2223/54486* (2013.01); *H01L 2224/0401* (2013.01); *H01L 2224/04105* (2013.01); *H01L 2224/0557* (2013.01); *H01L 2224/06181* (2013.01); *H01L 2224/08225* (2013.01); *H01L 2224/131* (2013.01); *H01L 2224/13147* (2013.01); *H01L 2224/16145* (2013.01); *H01L 2224/293* (2013.01); *H01L 2224/2929* (2013.01); *H01L 2224/29311* (2013.01); *H01L 2224/29318* (2013.01); *H01L 2224/29323* (2013.01); *H01L 2224/29324* (2013.01); *H01L 2224/29347* (2013.01); *H01L 2224/29366* (2013.01); *H01L 2224/29387* (2013.01); *H01L 2224/29393* (2013.01); *H01L 2224/32145* (2013.01); *H01L 2224/32225* (2013.01); *H01L 2224/73204* (2013.01); *H01L 2224/73259* (2013.01); *H01L 2224/73267* (2013.01); *H01L 2224/81132* (2013.01); *H01L 2224/83132* (2013.01); *H01L 2224/83191* (2013.01); *H01L 2224/83192* (2013.01); *H01L 2224/83224* (2013.01); *H01L 2224/9222* (2013.01); *H01L 2224/92125* (2013.01); *H01L 2224/92143* (2013.01); *H01L 2224/94* (2013.01); *H01L 2225/06541* (2013.01); *H01L 2924/10252* (2013.01); *H01L 2924/10253* (2013.01); *H01L 2924/10328* (2013.01); *H01L 2924/10329* (2013.01); *H01L 2924/10332* (2013.01); *H01L 2924/10335* (2013.01); *H01L 2924/10525* (2013.01); *H01L 2924/12042* (2013.01); *H01L 2924/14* (2013.01); *H01L 2924/1431* (2013.01); *H01L 2924/1433* (2013.01); *H01L 2924/1434* (2013.01); *H01L 2924/1579* (2013.01); *H01L 2924/15311* (2013.01); *H01L 2924/15787* (2013.01); *H01L 2924/15788* (2013.01); *H01L 2924/18161* (2013.01); *H01L 2924/3511* (2013.01)

(58) Field of Classification Search
CPC ........ H01L 24/19; H01L 24/29; H01L 24/32; H01L 24/75; H01L 24/83; H01L 24/92; H01L 25/0657

USPC .................. 257/783, 686, 707; 438/118, 119
See application file for complete search history.

(56) References Cited

U.S. PATENT DOCUMENTS

| | | | |
|---|---|---|---|
| 6,403,460 B1 * | 6/2002 | Lin | H01L 21/2885 257/693 |
| 2001/0002728 A1 | 6/2001 | Tsukada et al. | |
| 2002/0173134 A1 | 11/2002 | Viswanadam et al. | |
| 2004/0020901 A1 * | 2/2004 | Conlon | H01L 21/481 219/121.6 |
| 2004/0087714 A1 * | 5/2004 | Baumgart | C08G 18/2875 524/589 |
| 2004/0241958 A1 * | 12/2004 | Guarini | H01L 21/6835 438/455 |
| 2005/0070084 A1 | 3/2005 | Hsu et al. | |
| 2005/0242442 A1 | 11/2005 | Greco et al. | |
| 2006/0009009 A1 * | 1/2006 | Hara | H01L 21/67092 438/464 |
| 2006/0244140 A1 | 11/2006 | Hu | |
| 2007/0114366 A1 | 5/2007 | Wisnudel et al. | |
| 2007/0155054 A1 | 7/2007 | Hsu | |
| 2007/0194415 A1 * | 8/2007 | Seng | H01L 25/0657 257/678 |
| 2007/0275503 A1 | 11/2007 | Lin et al. | |
| 2007/0281247 A1 | 12/2007 | Phillips et al. | |
| 2008/0194079 A1 | 8/2008 | Yamamoto et al. | |
| 2009/0007933 A1 | 1/2009 | Thomas et al. | |
| 2010/0084763 A1 | 4/2010 | Yu | |
| 2011/0132443 A1 | 6/2011 | Schultz-Wittman et al. | |
| 2012/0104625 A1 | 5/2012 | Park et al. | |
| 2012/0107549 A1 | 5/2012 | Wang et al. | |
| 2012/0184099 A1 | 7/2012 | Souter | |
| 2012/0314992 A1 | 12/2012 | Lee | |
| 2012/0318326 A1 * | 12/2012 | Nishikawa | H01L 31/056 136/246 |
| 2013/0063826 A1 | 3/2013 | Hoffmuller et al. | |
| 2013/0113114 A1 | 5/2013 | Hosseini et al. | |
| 2014/0001583 A1 | 1/2014 | Teh et al. | |
| 2014/0147986 A1 * | 5/2014 | Dang | H01L 21/02002 438/458 |
| 2014/0242743 A1 * | 8/2014 | Wallace | G01J 3/04 438/69 |
| 2014/0273431 A1 | 9/2014 | Sasagawa | |

OTHER PUBLICATIONS

Office Action dated May 12, 2014 for U.S. Appl. No. 13/830,126, 10 pages.
Final Office Action dated Dec. 18, 2014 for U.S. Appl. No. 13/830,126, 15 pages.
Office Action dated May 28, 2015 for U.S. Appl. No. 13/830,126, 20 pages.
Final Office Action dated Nov. 5, 2015 for U.S. Appl. No. 13/830,126, 13 pages.
Notice of Allowance dated Apr. 18, 2016 for U.S. Appl. No. 13/830,126, 7 pages.

* cited by examiner

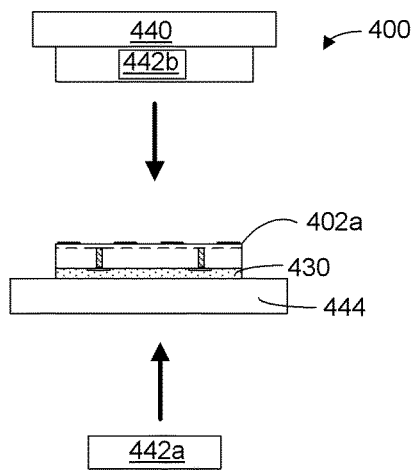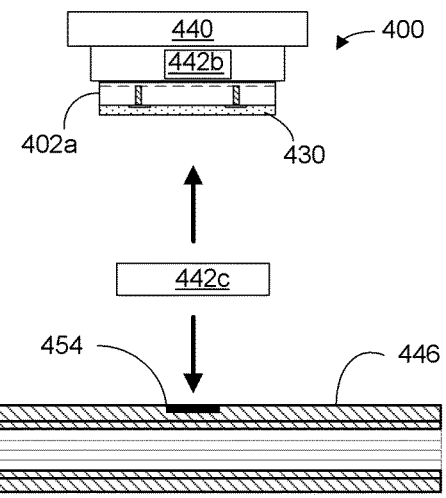
FIG. 4a
FIG. 4b
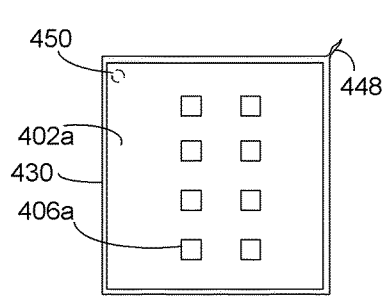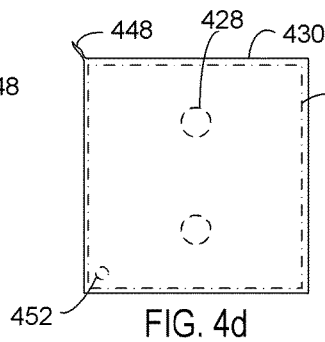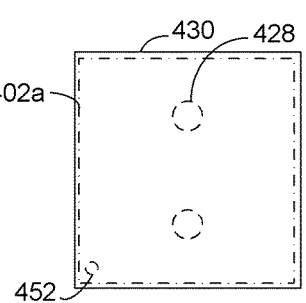
FIG. 4c
FIG. 4d
FIG. 4e
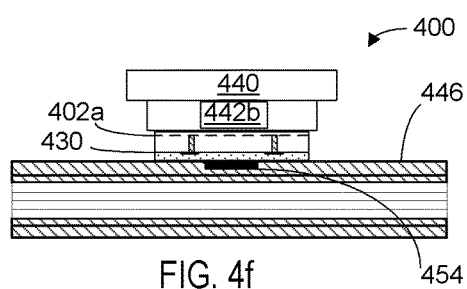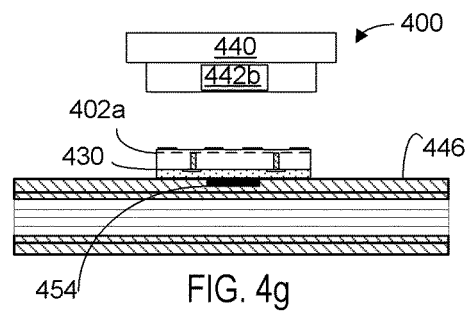
FIG. 4f
FIG. 4g

LASER DIE BACKSIDE FILM REMOVAL FOR INTEGRATED CIRCUIT (IC) PACKAGING

RELATED APPLICATIONS

This application is a divisional of U.S. patent application Ser. No. 13/830,126, entitled "LASER DIE BACKSIDE FILM REMOVAL FOR INTEGRATED CIRCUIT (IC) PACKAGING," filed on Mar. 14, 2013, which is herein incorporated by reference in its entirety.

FIELD

Embodiments of the present disclosure generally relate to the field of integrated circuits, and more particularly, to techniques and configurations for die backside film (DBF) and removal thereof from a package assembly.

BACKGROUND

Bumpless Build-Up Layer (BBUL) is an integrated circuit (IC) packaging technology in which build-up layers are applied onto one or more substrate-embedded dies. In conventional process flows for such packages, die backside film (DBF) is used to bond the inactive side of a die to a panel. The DBF is subsequently removed by plasma etching and wet mechanical cleaning.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIGS. 4a-g schematically illustrate various stages of package assembly fabrication, in accordance with various embodiments.

DETAILED DESCRIPTION

Figure 1:
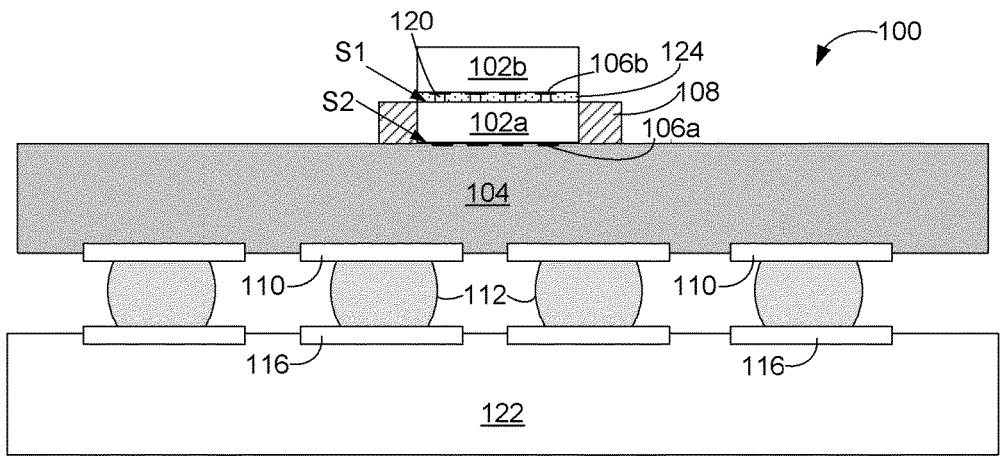
FIG. 1 illustrates a schematic cross-section side view of an example integrated circuit (IC) package assembly, in accordance with various embodiments.

Embodiments of the present disclosure describe techniques and configurations for die backside films (DBFs) and removal of DBFs from die surfaces. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings which form a part hereof, wherein like numerals designate like parts throughout unless otherwise indicated, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first feature formed, deposited, or otherwise disposed on a second feature," may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the phrase "through-silicon via" or "TSV" may be used in reference to an electrically conductive through-hole that extends at least partially through a die or other semiconductor substrate/device, such as an interposer. The phrase "through-silicon via" or "TSV" may be used for such electrically conductive features even when the semiconductor material is composed of a material other than silicon.

In various embodiments, a package assembly may be provided with an adhesive layer, such as a die backside film. In some embodiments, the adhesive layer may be transparent to a first wavelength of light, allowing a portion of a die (e.g., a "back" or "inactive" side) to be imaged and/or viewed through the adhesive layer during alignment/positioning of the die. In various embodiments, the adhesive layer may be configured to be selectively marked using laser energy that has a second wavelength. In various embodiments, the adhesive layer may be selectively removed using laser energy that has a third wavelength. Any one or more of the first, second, and third wavelengths may be wavelengths in the range of 390-740 nm (visible range) and/or in the range of 10-390 nm (ultraviolet range), 390-740 nm (visible range), or 740 nm to 1,000 µm (infrared range). In some embodiments, a wavelength of light in the infrared range may be a wavelength in the near-infrared range (750-1400 nm), short-wavelength infrared range (1400-3000 nm), mid-wavelength infrared range (3000-8000 nm), long-wavelength infrared range (8000-15 µm), or far infrared range (15-1000 µm). In some embodiments, a wavelength of light in the ultraviolet range may be a wavelength in the extreme ultraviolet range (10-121 nm), far ultraviolet range (122-200 nm), middle ultraviolet range (200-300 nm), or near ultraviolet range (300-390 nm).

FIG. 1 depicts a schematic side cross-sectional view of an integrated circuit (IC) package assembly 100, in accordance with various embodiments. IC package assembly 100 may include a first die 102a, a package substrate 104, and a circuit board 122. IC package assembly 100 is one example of a stacked die configuration in which first die 102a is coupled to a package substrate 104, and a second die 102b is coupled with first die 102a, in accordance with various embodiments.

First die 102a may have a first side S1 and a second side S2 opposite to the first side S1. First side S1 may be the side of the die commonly referred to as the "inactive" or "back" side of the die. Second side S2 may include one or more transistors, and may be the side of the die commonly referred to as the "active" or "front" side of the die. Second side S2 of first die 102a may include one or more electrical routing features 106a. Similarly, second die 102b may include an "active" or "front" side with one or more electrical routing features 106b. In some embodiments, electrical routing features 106a/106b may be bond pads.

As illustrated, second die 102b may be coupled to first die 102a in a front-to-back configuration (e.g., the "front" or "active" side of second die 102b coupled to the "back" or "inactive" side S1 of first die 102a). In other configurations, dies may be coupled with one another in a front-to-front, back-to-back, or side-to-side arrangement. In various embodiments, one or more additional dies may be coupled with first die 102a, second die 102b, and/or with package substrate 104. Other embodiments may lack a second die 102b. In various embodiments, as described below with reference to FIG. 2a, first die 102a may include one or more through-silicon vias (TSVs).

Second die 102b may be coupled to first die 102a by die interconnects 120. In various embodiments, die interconnects 120 may be solder bumps, copper pillars, or other electrically conductive features. In some embodiments, an interface layer 124 may be provided between first die 102a and second die 102b. Interface layer 124 may be, or may include, a layer of underfill, adhesive, dielectric, or other material. Interface layer 124 may serve various functions, such as providing mechanical strength, conductivity, heat dissipation, or adhesion.

In some embodiments, first die 102a and second die 102b may be singulated dies. In other embodiments, first die 102a and/or second die 102b may include two or more dies. For example, in some embodiments first die 102a and/or second die 102b may be a wafer (or portion thereof) having two or more dies formed thereon. In other embodiments, first die 102a and/or second die 102b may include two or more dies embedded in an encapsulant, arranged side-by-side, vertically stacked, or in any other suitable arrangement. In various embodiments, the IC package assembly 100 may include, for example, combinations of flip-chip and wire-bonding techniques, interposers, multi-chip package configurations including system-on-chip (SoC) and/or package-on-package (PoP) configurations to route electrical signals.

In various embodiments, first die 102a and/or second die 102b may be a primary logic die. In other embodiments, first die 102a and/or second die 102b may be configured to function as memory, an application specific circuit (ASIC), a processor, or some combination thereof. For example, first die 102a may include a processor and second die 102b may include memory.

One or both of first die 102a and second die 102b may be embedded in an encapsulant 108. Encapsulant 108 can be any suitable material, such as (but not limited to) an Ajinomoto Build-up Film (ABF) substrate, other dielectric/organic materials, resins, epoxies, polymer adhesives, silicones, acrylics, polyimides, cyanate esters, thermoplastics, and/or thermosets.

First die 102a may be coupled to package substrate 104. In some embodiments, package substrate 104 may be a coreless substrate. For example, package substrate 104 may be a bumpless build-up layer (BBUL) assembly that includes a plurality of "bumpless" build-up layers. As used herein, "bumpless build-up layers" may refer to layers of substrate and components embedded therein without the use of solder or other attaching means that may be considered "bumps." In various embodiments, one or more build-up layers described herein may have material properties that may be altered and/or optimized for reliability, warpage reduction, and so forth. In other embodiments, package substrate 104 may be composed of a polymer, ceramic, glass, or semiconductor material. In some embodiments, package substrate 104 may be a conventional cored substrate and/or an interposer.

In some embodiments, circuit board 122 may be a printed circuit board (PCB) composed of an electrically insulative material such as an epoxy laminate. For example, the circuit board 122 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Structures (not shown) such as traces, trenches, vias may be formed through the electrically insulating layers to route the electrical signals of the first die 102a through the circuit board 122. The circuit board 122 may be composed of other suitable materials in other embodiments.

Only a portion of the circuit board 122 may be depicted in FIG. 1. The circuit board 122 may include other electrical devices coupled to the circuit board that are configured to route electrical signals to or from the die 102a through the circuit board 122. The circuit board 122 may be a motherboard (e.g., motherboard 802 of FIG. 8) in some embodiments.

A first side of package substrate 104 may be coupled to second surface S2 and/or electrical routing features 106a of first die 102a. A second opposite side of package substrate 104 may be coupled to circuit board 122 by package interconnects 112. Package interconnects 112 may couple electrical routing features 110 disposed on the second side of package substrate 104 to corresponding electrical routing features 116 on circuit board 122. Package substrate 104 may have electrical routing features formed therein to route electrical signals between the first die 102a (and/or the second die 102b) and circuit board 122 and/or other electrical components external to the IC package assembly 200. Package interconnects 112 and die interconnects 120 may include any of a wide variety of suitable structures and/or materials including, for example, bumps, pillars or balls formed using metals, alloys, solderable material, or combinations thereof. In various embodiments, electrical routing features 110 may be arranged in a ball grid array ("BGA") or other configuration.

Figure 2A:
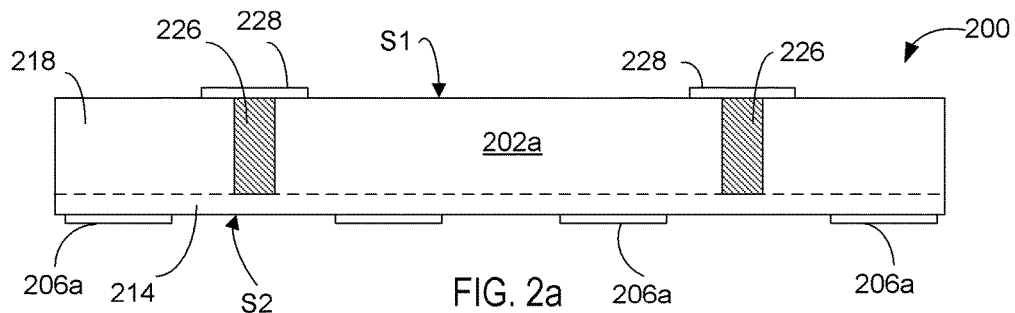
FIG. 2a illustrates a schematic cross-section side view of a die portion of an IC circuit assembly, in accordance with various embodiments.

FIG. 2a illustrates a schematic cross-section side view of a die portion of an IC package assembly 200, in accordance with various embodiments. For example, FIG. 2a may depict the first die 102a of FIG. 1, according to various embodiments.

In some embodiments, as described above, die 202a may have a first side S1 and a second side S2. Second side S2 may have an active layer 214 with one or more transistors/circuits formed thereon. Electrical routing features 206a, such as bond pads, may be arranged on second side S2.

First side S1 may include a semiconductor substrate 218 composed of a semiconductor material. The semiconductor substrate 218 may be composed of n-type or p-type material systems and may include, for example, a crystalline substrate formed using a bulk silicon or a silicon-on-insulator substructure. In some embodiments, the semiconductor substrate 218 may be formed using alternate materials, which may or may not be combined with silicon, that include but are not limited to germanium, indium antimonide, lead telluride, indium arsenide, indium phosphide, gallium arsenide, or gallium antimonide. Other group II-VI, III-V or group IV material systems may also be used to form the semiconductor substrate 218 according to various embodiments.

First side S1 may also include one or more electrical routing features 228, such as TSV pads. One or more TSVs 226 may be formed at least partially through semiconductor substrate 218 to route electrical signals between the active layer 214 and the electrical routing features 228 on first side S1 of first die 102a.

Figure 2B:
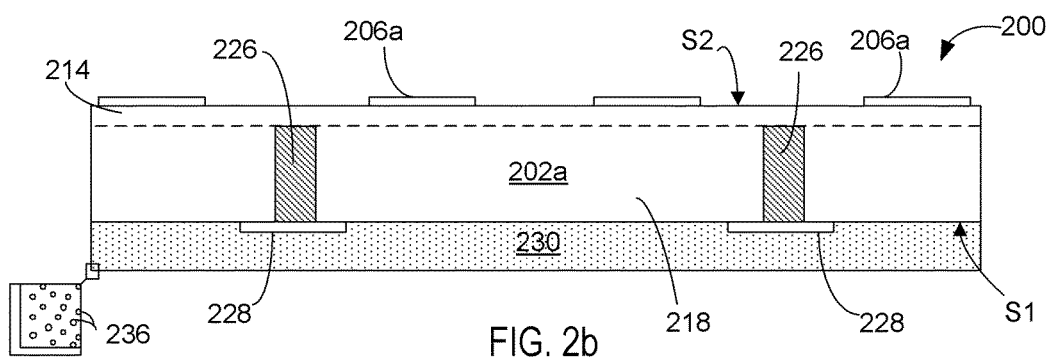
FIG. 2b illustrates a schematic cross-section side view of a die and adhesive layer portion of an IC circuit assembly, in accordance with various embodiments.

FIG. 2b illustrates a schematic cross-section side view of a die and an adhesive layer portion of an IC package assembly 200, in accordance with various embodiments. Again, FIG. 2b may depict the first die 102a of FIG. 1 and die 202a of FIG. 2, according to various embodiments. In FIG. 2b, adhesive layer 230 is shown coupled to the first side S1. In various embodiments, adhesive layer 230 may be a die backside film (DBF).

In an embodiment, adhesive layer 230 may cover the electrical routing features 228 during subsequent processing of the die 202a, as further described herein. Some portions of adhesive layer 230 may be retained after the further processing to be used as a permanent part of a final package structure, to protect die 202a, impart mechanical strength/warpage resistance, and/or to provide a surface for marking.

In an embodiment, adhesive layer 230 may be applied to the first side S1 of the die 202a prior to building up layers of a microelectronic package structure. In some embodiments, adhesive layer 230 may be applied onto die 202a and a plurality of other dies while die 202a and the other dice are in wafer form (not shown). In other embodiments, adhesive layer 230 may be applied to die 202a after singulation of die 202a from a wafer. As further described for example in FIGS. 3-7 and the accompanying description, the adhesive layer 230 may be used to attach the die 202a to a substrate, such as panel 446 of FIG. 4b, before forming build-up layers of a package structure on the panel and die(s). Adhesive layer 230 may be used to hold die 202a in a desired position on the panel during the build-up process and/or for laser marking.

Adhesive layer 230 may be a clear or transparent film that includes a polymer matrix. Examples of suitable materials for adhesive layer 230 may include, but are not limited to, epoxy, acrylic, polyimide, epoxy-acrylate, other polymer materials, and combinations thereof. In some embodiments, adhesive layer 230 may be transparent to a first wavelength of light to which the first side S1 of die 202a is substantially opaque. In some embodiments, the first wavelength of light may be a wavelength of light in the range of 390-740 nm (visible range) and/or in the range of 10-390 nm (ultraviolet range). In other embodiments, the first wavelength of light may be a wavelength of light in the range of 740-3000 nm or 740 nm to 1000 μm. In some embodiments, adhesive layer 230 may be clear or transparent to one or more wavelengths of light in the range of 390-740 nm, which may allow vision systems to detect the first side S1 of die 202a through adhesive layer 230 while positioning first die 202a for further processing of a package assembly.

In addition, adhesive layer 230 may be configured to be photoreactive to a second wavelength of light, such that exposure to the second wavelength of light causes a change in color or transparency in the exposed portion of adhesive layer 230. In some embodiments, adhesive layer 230 may include a plurality of nanoparticles 236 dispersed within a polymer matrix. The nanoparticles 236 may have a size of less than 100 nm. In some embodiments, nanoparticles 236 may have a size in the range of 1-10 nm, 10-20 nm, 10-40 nm, 20-50 nm, 15-35 nm, 40-80 nm, or 30-90 nm. In some embodiments, the polymer matrix may comprise polymer chains that are larger in size than the nanoparticles. This may induce space constraints and prevent the alignment of polymer chains to form large crystal structures that would decrease transparency of adhesive layer 230.

Nanoparticles 236 may include any suitable laser energy absorbing additive used for laser marking. Examples of such additives include, but are not limited to, carbon black, graphite, zirconium silicates, calcium silicates, zeolite, cordierite, mica, kaolin, talc, silica, aluminum silicates, metal salts such as copper phosphates, metals/semi-metals (e.g., aluminum, boron, titanium, magnesium, copper, tin, silicon, zinc, etc.), and metal oxides. In some embodiments, nanoparticles 236 may be 0.01 to 10% or 0.01 to 50%, by weight, of adhesive layer 230. In other embodiments, nanoparticles 236 may be "quantum dots." Quantum dots may be particles of a semiconductor material, such as a selenide or sulfide of a metal (e.g., cadmium or zinc), having a diameter of 2-10 nm.

In various embodiments, nanoparticles 236 may be, or may include, a phase transition material. For example, in some embodiments, the phase transition material may be a metal oxide, such as (but not limited to) vanadium dioxide ($VO_2$). Phase transition materials may configured to switch from a transparent state, in which they are transparent to light of a particular wavelength, to a reflective state or an absorptive state, in which they absorb laser energy, in response to application of heat and/or laser energy. In some embodiments, nanoparticles 236 may be $VO_2$ nanoparticles, and adhesive layer 230 may be configured to become reflective in response to heating at the die bonding temperature. In other embodiments, nanoparticles 236 may be $VO_2$ nanoparticles, adhesive layer 230 may be transparent after heating at the die bonding temperature, and nanoparticles 236 may be selectively switched to a reflective state by laser irradiation to mark adhesive layer 230. In other embodiments, nanoparticles 236 may be $VO_2$ nanoparticles, and heating adhesive layer 230 at the die bonding temperature may cause a phase change in the $VO_2$ nanoparticles, rendering adhesive layer 230 opaque.

Nanoparticles 236 may absorb laser energy at a wavelength in the infrared range (e.g., in the near and short-wave infrared ranges, 740 nm to 3000 nm), the visible range (390 nm to 740 nm), or the ultraviolet range (e.g., in the far, middle, and/or near ultraviolet ranges 122 nm to 390 nm). In some embodiments, nanoparticles 236 may absorb laser energy at a wavelength of 240-355 nm. In some embodiments, the laser energy may be delivered by a visual wavelength and/or ultrafast (e.g., pico- or femtosecond) laser in the range of 1064-266 nm. In some embodiments, nanoparticles 236 may be configured to absorb laser energy and convert the laser energy to heat, which may cause foaming or carbonization of the polymer matrix surrounding the nanoparticles. This carbonization may result in the formation of a dark or opaque laser mark. In some embodiments, application of laser energy to adhesive layer 230 may cause nanoparticle agglomeration, resulting in a reduction in transparency to visible light and providing higher laser mark contrast.

In some embodiments, selective application of laser energy to adhesive layer 230 may produce a dark/opaque laser mark in the irradiated area, while adjacent portions of adhesive layer 230 remain transparent. In other embodiments, the application of laser energy and/or heating may cause adhesive layer 230 to become reflective or less transparent, and a laser mark may be formed by laser ablation of a surface portion of adhesive layer 230. The change in surface texture resulting from the ablation may provide sufficient contrast for detection of the resulting laser mark. In some embodiments, nanoparticles 236 may be $VO_2$ nanoparticles dispersed within adhesive layer 230, and may be switched from a transparent state to reflective/absorptive state by laser irradiation and/or by heating to above a threshold temperature (e.g., 70° C.).

In other embodiments, adhesive layer 230 may include a thermochromic dye that is configured to impart a color to adhesive layer 230 when it is heated to a particular temperature. In some embodiments, a thermochromic dye may be configured to be substantially colorless, or lightly colored, until the dye (within adhesive layer 230) is heated to a threshold temperature, and to become colored or more intensely colored upon heating to the threshold temperature. The threshold temperature may vary among embodiments, but may be within the range of 70-80° C., 80-90° C., 90-100° C., 100-120° C., 120-140° C., or 140-180° C. Thermochromic pigments/dyes may be liquid crystal compounds or "leuco" dyes. Liquid crystal compounds and/or leuco dyes may be present in a variety of colors and active temperature ranges (e.g., room temp color change to 70° C. and beyond). In some embodiments, one or more thermochromic pigments/dyes may be mixed with a "static" pigment/dye to get a specific color before and after reflow. Example of leuco dyes include lactone molecules, and examples of liquid crystal compounds include esters of cholesterol, ester derivatives of (S)-4-(2-methylbutyl)phenol], and others. The threshold temperature of the thermochromic dye may be a temperature that is less than or equal to a die bonding temperature at which die 202a is bonded to a substrate, such as a panel. Thus, adhesive layer 230 may be transparent/clear before die 202a is bonded to a substrate, and colored or less transparent after the bonding process. This may provide better contrast for laser marking adhesive layer 230. In some embodiments, the resulting color may be substantially permanent. In other embodiments, the resulting color may be intensified upon additional heating at higher temperatures (e.g., 180-220° C., 220-250° C.). In other embodiments, adhesive layer 230 may include a plurality of quantum dots.

In various embodiments, adhesive layer 230 may be photocurable. For example, adhesive layer 230 may be a UV-curable adhesive film. In some embodiments, adhesive layer 230 may be transparent to one or more wavelengths of visible light in the range of 390-740 nm, photoreactive (e.g., for laser marking) to another wavelength of light in the range of 10-390 nm, 390-740 nm, or 740 nm to 1000 μm, and removable from die 202a by laser radiation with a wavelength of 266 nm or 355 nm. In some embodiments, adhesive layer 230 may be curable by laser radiation with a wavelength in the range of 10-390 nm (e.g., a wavelength of 240 to 355 nm).

Figure 3:
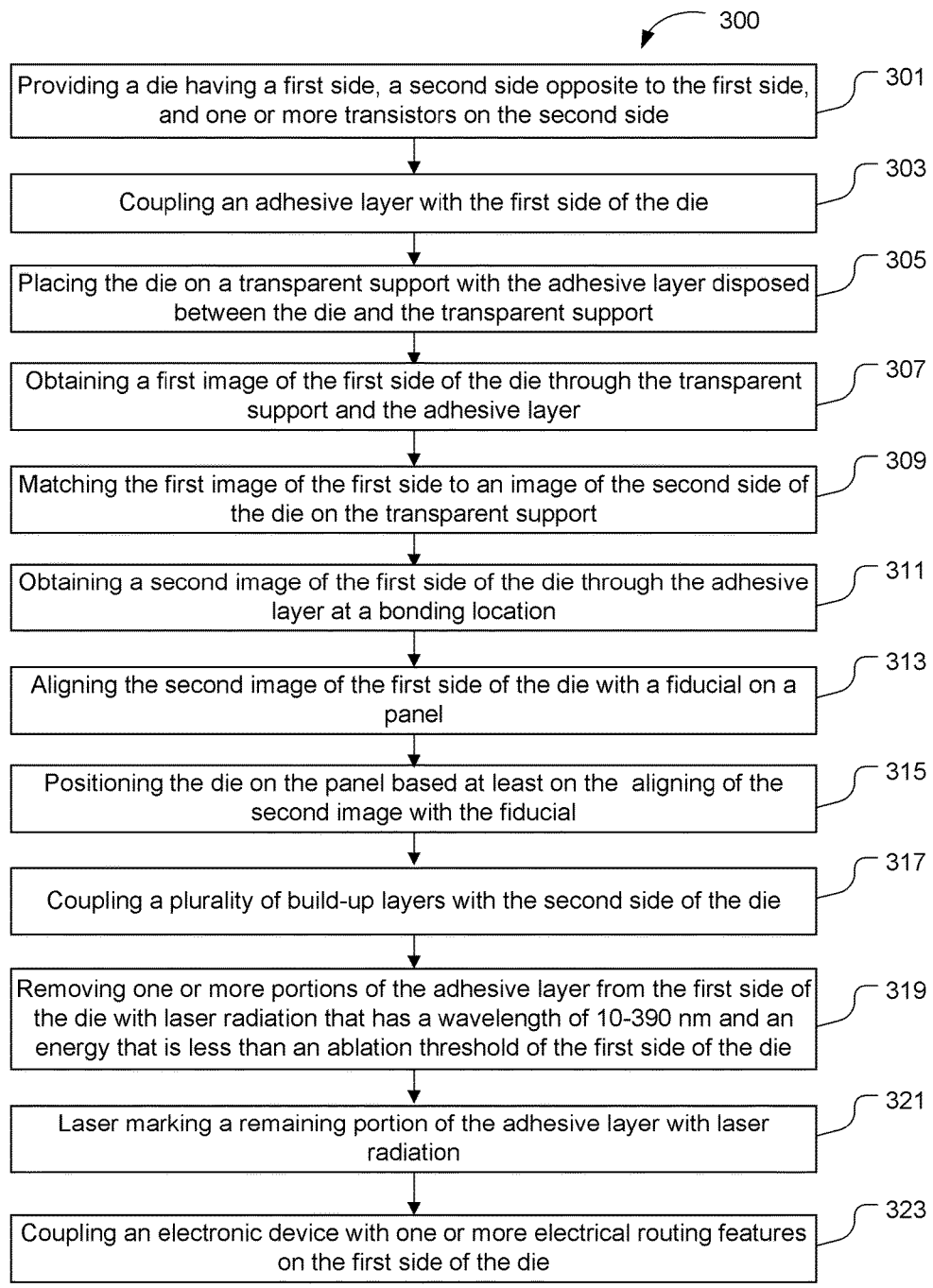
FIG. 3 schematically illustrates a flow diagram for a method of fabricating a package assembly, in accordance with some embodiments.

FIG. 3 schematically illustrates a flow diagram for a method 300 of fabricating a package assembly, in accordance with some embodiments. FIGS. 4-7 depict various stages of fabrication, in accordance with various embodiments, and will be described with reference to FIG. 3.

At block 301, a die with a first side, a second side opposite to the first side, and one or more transistors on the second side may be provided. In some embodiments, the die may be configured as described above with regard to die 102a/202a. For example, the die may have one or more TSVs conductively coupled to TSV pads on the first side of the die and to the transistors on the second side of the die.

At block 303, an adhesive layer may be coupled with the first side of the die. The adhesive layer may be, for example, adhesive layer 230. In some embodiments, the adhesive layer may be transparent to a first wavelength of light (e.g., a wavelength in the range of 390-740 nm), and the first side of the die may reflect, or be opaque to, the first wavelength of light. The adhesive film may also be photoreactive to a second wavelength of light (e.g., laser energy with a wavelength in the range of 10-390 nm, 390-740 nm, or 740-3000 nm). The adhesive layer 230 may be configured to exhibit a change in color or transparency in response to the second wavelength of light. In other embodiments, the adhesive layer may also be, for example, UV-curable.

At block 305, the die may be placed on a support with the adhesive layer disposed between the die and the support. The support may be transparent to the first wavelength of light. In some embodiments, the support may be, for example, a plate of glass or other clear material.

FIGS. 4a-b depict a schematic cross-section side view of further processes of package assembly fabrication, including interactions of a die bonder 400 with die 402a. FIG. 4a depicts die 402a coupled to support 444 by adhesive layer 430, and positioned for processing by die bonder 400. Die bonder 400 may include, for example, a die bonding head 440 and a vision system including one or more cameras 442a-c. In various embodiments, die bonding head 440 may be configured remove die 402a from support 444 and move die 402a to a bonding site. The bonding site may be, for example, a position above a panel 446 (FIG. 4b) to which die 402a is to be bonded. Die bonding head 440 may be configured to position die 402a in the X, Y, and Z directions. In some embodiments, as illustrated in FIGS. 4b, 4f, and 4g, panel 446 may be a peelable sacrificial panel that includes an epoxy core disposed between thin layers of a metal, such as copper foil.

Camera 442a may be positioned to detect the first side of die 402a through the support 444 and adhesive layer 430. Camera 442b may be positioned to detect the second side of die 402a. In some embodiments, camera 442a may be an upward-looking camera positioned below support 444, camera 442b may be a downward-looking camera positioned above support 444, and camera 442c (FIG. 4b) may be positionable between die bonding head 440 and panel 446. In various embodiments, camera 442c may be a two-sided camera configured to capture images of objects both above and below camera 442c. In some embodiments, camera 442b may be mounted to die bonding head 440 or to another component of die bonder 400. In other embodiments, camera 442b may be an integral component of die bonding head 440. Cameras 442a-c may be, for example, charge coupled device (CCD) image sensors.

In various embodiments, die bonder 400 may include a storage medium (not shown) with one or more image processing algorithms and a processor (not shown) configured to execute the image processing algorithms. Examples of such algorithms include, but are not limited to, image matching, pattern/template matching, edge search, and center-point search (blob analysis), and others. In some embodiments, die bonder 400, die bonding head 440, and/or cameras 442a-c may be partially or fully automated.

Referring again to FIG. 3, at block 307, a first image of the first side of the die may be obtained through the transparent support and the adhesive layer. For example, camera 442a may capture an image of the first side of die 402a through support 444 and adhesive layer 430. Camera 442b may capture an image of the second side of die 402a at block 307 (e.g., while die 402a is on support 444).

At block 309, the vision system may match the first image of the first side of the die to the image of the second side of the die on the support. FIGS. 4c and 4d depict schematic views of example images of the second side and the first side, respectively, of die 402a at this stage of fabrication.

As illustrated in FIG. 4c, an image of the second side of die 402a may indicate one or more features such as electrical routing features 406a and/or outer contours of die 402a or adhesive layer 430. In some embodiments, the second side of die 402a may include a fiducial 450 that may be used as a landmark for image matching, for positioning of die 402a, and/or for further processes (e.g., laser via drilling) by vision system (e.g., cameras 442a-c), die bonding device (e.g., die bonding head 440), or other devices. In various embodiments, the image of the second side of die 402a may show one or more stringers 448, if present, at an edge of adhesive layer 430. Stringers 448 may occur, for example, during processes in which adhesive layer 430 is applied at the wafer level and dies are subsequently singulated from the wafer.

As illustrated in FIG. 4d, an image of the first side of die 402a may indicate the outer contours of die 402a and/or electrical routing features 428 through adhesive layer 430. In some embodiments, the first side of die 402a may include one or more fiducials 452 that may be used as a landmark for image matching, for positioning of die 402a, and/or for further processes (e.g., laser via drilling) by vision system (e.g., cameras 442a-c), die bonding device (e.g., die bonding head 440), or other devices. In some embodiments, the image of the first side of die 402a may also show stringers 448, if present.

The images may be matched at block 309 based at least one or more respective features of the first side (e.g., fiducial 450, electrical routing features 406a, and/or outer contours of die 402a) and/or the second side (e.g., electrical routing features 428, fiducial 452, and/or outer contours of die 402a). In some embodiments, other features such as stringers 448, if present, may be excluded from this and/or other image matching/analysis processes.

At block 311, a second image of the first side of the die may be obtained through the adhesive layer at a bonding location. FIG. 4b depicts a schematic side view of a process stage corresponding to block 311. At this stage, die 402a is retained by die bonding head 440 above panel 446. As illustrated, camera 442c may be a two-sided view camera positioned between panel 446 and die bonding head 440. Camera 442c may capture the second image of the first side of die 402a from below die 402a.

In some embodiments, the first and second images of the first side of the die may be compared at block 311. This comparison may be done, for example, to assess the position/alignment of die 402a on die bonding head 440. As depicted for example in FIG. 4e, because adhesive layer 430 is transparent, one or more features of the first side of die 402a (e.g., electrical routing features 428 and/or outer contours of die 402a) may be detectable through adhesive layer 430. Thus, even without fiducials 452, the first and second images of the first side of die 402a may be compared based at least on features visible through adhesive layer 430.

In some embodiments, die bonding head 440 may be configured to preheat die 402a to at least partially cure or otherwise prepare adhesive layer 430 for bonding of die 402a to panel 446. In other embodiments, a light source (e.g., a UV laser) may be applied to adhesive layer 430 for partial curing in preparation for bonding to panel 446. Pre-heating and/or curing of adhesive layer 430 prior to bonding to panel 446 may cause a change in shape of adhesive layer 430. For example, as depicted in FIG. 4e, stringers 448 may be lost as adhesive layer 430 is heated/cured. However, because adhesive layer 430 is transparent at this stage, features of the first side of die 402a remain visible and can be used for matching/comparing images of die 402a.

At block 313, the second image of the first side of the die may be aligned with a fiducial on a panel. As depicted for example in FIG. 4b, panel 446 may have a fiducial 454. Fiducial 454 may be disposed in any suitable location on panel 446, and formed by conventional processes. Camera 442c may capture an image of panel 446 with fiducial 454, and the second image of the first side of the die may be aligned with the image of panel 446 based at least on fiducial 454 and one or more features of the first side of die 402a (e.g., electrical routing features 428, outer contours of die 402a, and/or fiducial 452).

At block 315, the die may be positioned on the panel based at least on the aligning of the second image with the fiducial. As depicted for example in FIG. 4f, die bonding head 440 may place die 402a onto panel 446 based on the alignment of the second image of the first side of die 402a and fiducial 454. At this stage, die 402a may be bonded to panel 446. In some embodiments, die 402a may be bonded to panel 446 by heating adhesive layer 430 to a bonding temperature. The bonding temperature may be a temperature in the range of 50-200° C. For example, the bonding temperature may be a temperature of 50-70° C., 70-90° C., 90-110° C., 110-130° C., 130-150° C., or 150-200° C. In other embodiments, die 402a may be bonded to panel 446 by curing adhesive layer 430 with laser energy (e.g., UV laser light). In still other embodiments, die 402a may be bonded to panel 446 by applying one or more of pressure, heat, and/or laser energy in any suitable combination. In various embodiments, heat, laser energy, and/or pressure may be applied to die 402a on panel 446 by die bonding head 440 and/or by other devices. After die 402a has been positioned and/or bonded on panel 446, die bonding head 440 may release die 402a (FIG. 4g).

In some embodiments, adhesive layer 430 may be configured to remain transparent after bonding to panel 446. In other embodiments, adhesive layer 430 may be configured to become less transparent, colored, or opaque in response to heating to the bonding temperature. For example, adhesive layer 430 may include a thermochromic dye configured to impart a color or intensify an existing color in response to heating, as discussed above. In various embodiments, adhesive layer 430 may include a phase transition material (e.g., $VO_2$) that causes adhesive layer 430 to become reflective in response to heating to the bonding temperature. In some embodiments, adhesive layer 430 may become transparent again after cooling (e.g., to a temperature of 68° C. or less). In other embodiments, adhesive layer 430 may remain reflective after cooling.

Figure 5A:
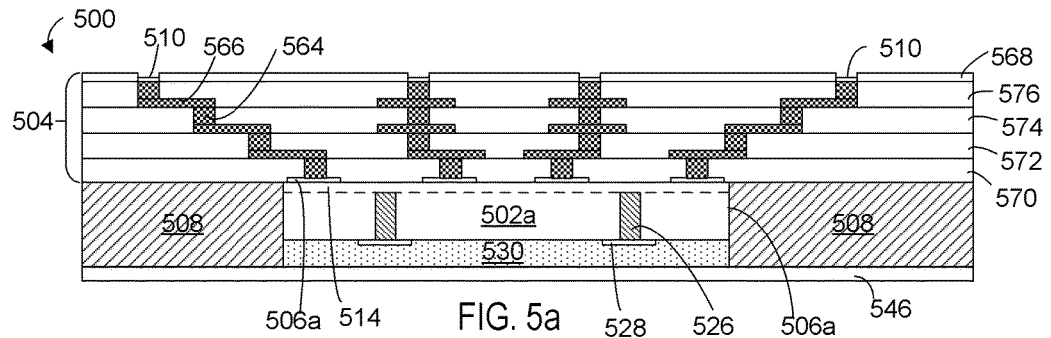
FIGS. 5a-c schematically illustrate additional stages of package assembly fabrication, in accordance with various embodiments.
Figure 6A:
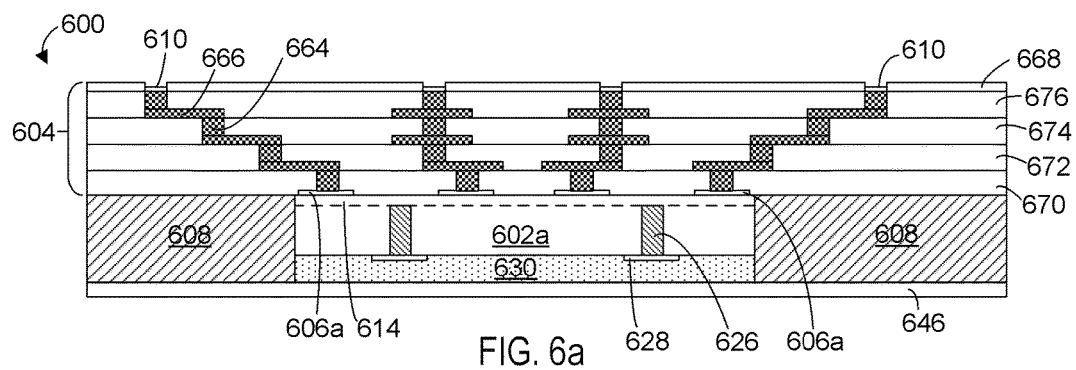
FIGS. 6a-c schematically illustrate additional stages of package assembly fabrication, in accordance with various embodiments.

At block 317, a plurality of build-up layers may be coupled with the second side of the die. FIGS. 5a and 6a depict examples of IC package assemblies 500 and 600, respectively, with a coreless package substrate 504/604 comprising a plurality of build-up layers. As illustrated, build-up layers 570/670, 572/672, 574/674, and 576/676 may be formed sequentially on die 502a/602a. In some embodiments, die 502a/602a may be embedded in encapsulant 508/608 before being bonded to panel 546/646. In other embodiments, die 502a/602a may be embedded in encapsulant 508/608 after being bonded to panel 546/646. In still other embodiments, die 502a/602a may not be embedded in encapsulant 508/608, or may be embedded in encapsulant 508/608 at a later stage of processing.

In some embodiments, forming the first build-up layer 570/670 may include laminating a dielectric material (e.g., ABS film) onto the active layer 514/614 of die 502a/602a. In some embodiments, die 502a/602a may be at least partially encapsulated within encapsulant 508/608, and the dielectric material may be laminated onto die 502a/602a and encapsulant 508/608. Next, vias 564/664 may be formed through the dielectric material by conventional methods, such as laser drilling, to expose electrical routing features 506a/606a. The vias 564/664 may then be filled/plated with an electrically conductive material (e.g., copper), and electrically conductive traces 566/666 may be formed on the dielectric material and vias by known methods. For example, vias 564/664 may be filled/plated with copper by electroless deposition, leaving a thin layer of electroless copper on the dielectric material. Next, a dry film resist may be formed on the layer of electroless copper and patterned by conventional lithographic techniques. Electrically conductive traces 566/666 may be formed in the openings of the patterned dry film resist (e.g., by electrolytic plating of copper in the openings). The patterned dry film resist may be stripped, and flash etching may be performed to remove the electroless copper exposed by the removal of the patterned dry film resist.

The next build-up layer 572/672 may be added by forming a layer of dielectric material on the first layer of dielectric material and the electrically conductive traces 566/666, and repeating the subsequent processes described above.

An outermost layer 568/668 may be formed on the outermost build-up layer. In some embodiments, outermost layer 568/668 may be, or may include, a layer of solder resist material. The outermost layer 568/668 may be patterned using conventional lithographic techniques to form openings over the vias 564/664 or electrically conductive traces 566/666 below. While FIGS. 5a and 6a illustrate configurations in which the openings of the outermost layer 568/668 are formed over filled vias 564/664, it is to be understood that in other configurations, the outermost layer 568/668 and the openings therein may be formed on electrically conductive traces 566/666.

Electrical routing features 510/610 may be formed within openings in outermost layer 568/668. In some embodiments, electrical routing features 510/610 may be formed by plating one or more metal layers into the openings in outermost layer 568/668. While FIGS. 5a and 6a illustrate package assemblies with four build-up layers, other embodiments may have one, two, three, or more than four build-up layers.

The vias 564/664 and electrically conductive traces 566/666 may define one or more electrical paths between electrical routing features 506a/606a and electrical routing features 510/610. Although vias in the drawings are shown as having uniformly straight sides, vias may have other shapes as well. For example, vias drilled by lasers may tend to have tapered shapes, e.g., with one end being larger than the opposite end.

The electrical paths may route electrical signals between active layer 514/614 of die 502a/602a and other components, such as circuit board 122 of FIG. 1. In some embodiments, the electrical signals may include, for example, input/output (I/O) signals and/or power or ground signals associated with the operation of first die 102a. In various embodiments, the electrical paths may not include solder, as they may be fabricated with other components using a BBUL process. In other embodiments, package assemblies may have a conventional cored substrate.

Figure 5B:
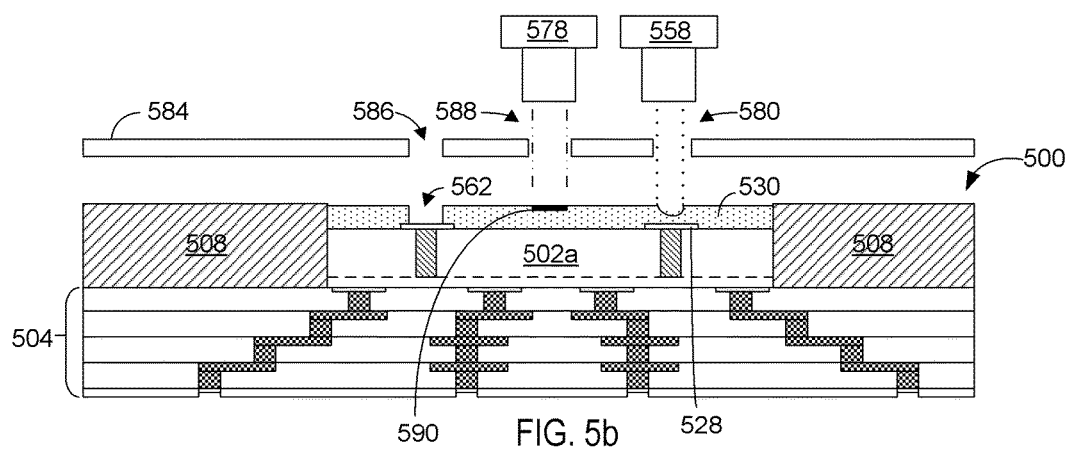
Figure 6B:
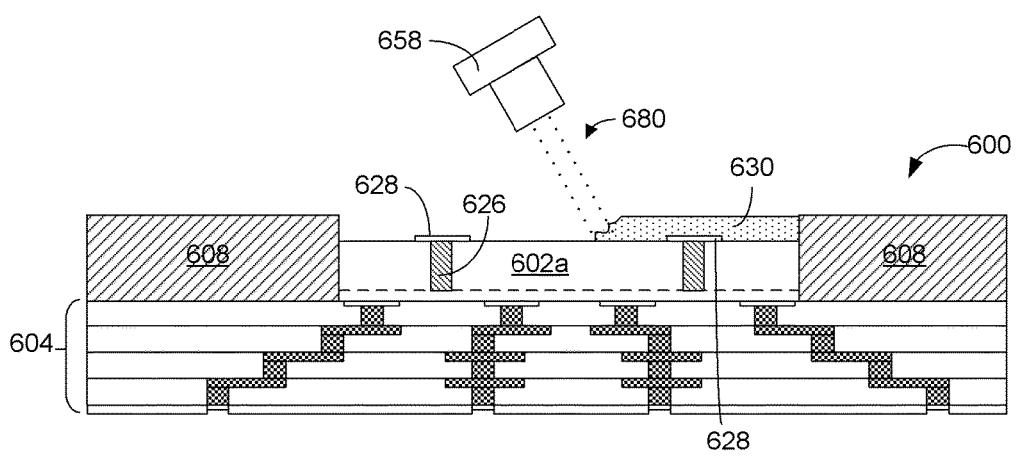

At block 319, one or more portions of the adhesive layer may be removed from the first side of the die with laser radiation. In some embodiments, the laser radiation may have a wavelength of 10-390 nm and an energy that is less than a laser damage threshold of the second side of the die. FIGS. 5b and 6b depict package assemblies 500 and 600, respectively, at corresponding process stages.

Referring first to FIG. 5b, a photo mask 584 may be positioned between a laser radiation source 558 and package assembly 500. Photo mask 584 may include one or more openings 586 that form a desired pattern. In some embodiments, an opening 586 may correspond to the entire adhesive layer 530. For example, in some 3D IC package assemblies, the entire adhesive layer 530 may be removed. In other embodiments, openings 562 may correspond to one or more electrical routing features 528 of die 502a. In some embodiments, laser radiation 580 may be used to selectively remove a portion of adhesive layer 530, creating an opening through adhesive layer 530 to expose an electrical routing feature 528.

Referring now to FIG. 6b, in other embodiments a laser radiation source 658 may be used to remove adhesive layer 630, or portions thereof, without the use of a photo mask. In some embodiments, adhesive layer 630 may be scanned with laser energy 680 to remove adhesive layer 630.

Current methodologies for removing DBF material after the build-up process involve plasma etching followed by a wet scrub to expose the die and the TSV pads. These processes may cause damage to the die and undesirable etching and/or release of fillers from other package assembly materials (e.g., ABF). In various embodiments, the irradiation of adhesive layer 530/630 with laser energy in the UV range (e.g., 10-390 nm) may cause photochemical ablation/ degradation of adhesive layer 530/630 and allow clean removal of adhesive layer 530/630 from die 502a/602a without damaging die 502a/602a.

Other embodiments may lack a block 319. For example, in some two-dimensional (2D) IC package assemblies, adhesive layer 530 may be a permanent DBF that is retained through the remaining processing stages and is included in the completed package assembly. In various embodiments, laser radiation 588 may be used to form a laser mark 590 on or within adhesive layer 530.

Laser radiation source 558/658 may be any suitable laser. Suitable lasers include, but are not limited to, solid state pulsed lasers, pulsed metal vapor lasers, excimer lasers and continuous wave lasers with pulse modification, such as the commercially available Nd:YAG laser (wavelength 1064 nm), frequency-doubled Nd:YAG laser (wavelength 532 nm), frequency-tripled Nd:YAG laser (wavelength 355 nm), frequency-quadrupled Nd:YAG laser (wavelength 266 nm), argon gas lasers (wavelength 488 nm and 514.5 nm), high-performance diode lasers (800 to 1000 nm), ruby lasers (694 nm), F2 excimer lasers (157 nm), ArF excimer lasers (193 nm), KrCl excimer lasers (22 nm), KrF excimer lasers (248 nm), XeCl excimer lasers (308 nm), XeF excimer lasers (351 nm), CO2 lasers (10.6 μm), helium-neon gas lasers (543 nm, 632.8 nm, 1150 nm), krypton gas lasers (330 to 360 nm, 420 to 800 nm), hydrogen gas lasers (2600 to 3000 nm), and nitrogen gas lasers (337 nm).

In some embodiments, laser radiation 580/680 may have a wavelength of 10-390 nm. For example, laser radiation 580/680 may have a wavelength of 355 nm (photon energy 3.6 eV), which may break carbon-carbon bonds within the polymer matrix of adhesive layer 530. As another example, laser radiation 580/680 may have a wavelength of 266 nm (photon energy 4.3 eV), which may break carbon-hydrogen bonds within the polymer matrix of adhesive layer 530. In some embodiments, laser radiation 580/680 may have an energy that is less than a UV laser silicon damage threshold, allowing adhesive layer 530/630 or portions thereof to be selectively removed without damaging die 502a/602a or electrical routing features 506a/606a.

Conditions for removal of an adhesive layer may vary among embodiments. Table 1 provides examples of conditions for the removal of an adhesive layer (e.g., adhesive layer 630) from a die (e.g., die 602a) using a pulsed 355 nm UV laser, in accordance with various embodiments. The example conditions are for adhesive layer removal from a die with a surface (first side) of 1 cm$^2$, using three passes of a single beam with a 70% pulse-to-pulse overlap and a fluence of 0.25 μJ/μm$^2$. These and other conditions shown in Table 1 may be adjusted to accommodate variations in die size, semiconductor material, laser energy source, adhesive layer composition/thickness, and other such factors. As such, these example conditions are not intended to be limiting.

TABLE 1

Example conditions for adhesive layer removal by photochemical ablation

| Power (W) | Frequency (kHz) | Beam Size (μm) | Pulse Energy (μJ) | Stage Speed (mm/min) | Galvo Speed (cm/sec) | Time per Pass (sec) |
|---|---|---|---|---|---|---|
| 0.4 | 45 | 35 | 8.89 | 28350 | 47.3 | 4.23 |
| 0.8 | 90 | 35 | 8.89 | 56700 | 94.5 | 2.12 |
| 0.8 | 45 | 70 | 17.78 | 56700 | 94.5 | 1.06 |

TABLE 1-continued

Example conditions for adhesive layer removal by photochemical ablation

| Power (W) | Frequency (kHz) | Beam Size (μm) | Pulse Energy (μJ) | Stage Speed (mm/min) | Galvo Speed (cm/sec) | Time per Pass (sec) |
|---|---|---|---|---|---|---|
| 1.6 | 90 | 70 | 17.78 | 113400 | 189.0 | 0.53 |
| 1.6 | 45 | 140 | 35.56 | 113400 | 189.0 | 0.26 |

In various embodiments, removing adhesive layer 530/630 or portions thereof by UV laser irradiation at a threshold below a laser damage threshold for the semiconductor material of die 502a/602a may reduce or eliminate the damage to die 502a/506a and/or other components of package assembly 500/600 (e.g., encapsulant 508/608) that is typically observed with conventional plasma etch techniques (e.g., filler residue from ABF material, undesirable etching). In addition, using UV laser radiation to remove adhesive layer 530/630 may allow the same adhesive layer material to be used in multiple types of package assemblies (e.g., for both 2D and 3D package assemblies), and with a variety of media/form factors (e.g., carrier based, strip based, quarter panel media).

At block 321, a remaining portion of the adhesive layer may be laser marked with laser radiation. Referring again to FIG. 5b, laser radiation source 578 or 558/658 or another laser may be used to apply laser radiation 588 to a selected portion of adhesive layer 530. In some embodiments, laser radiation 588 may have a wavelength that is absorbed by nanoparticles dispersed in adhesive layer 530. The nanoparticles may convert the laser energy to heat, resulting in the formation of laser mark 590. In other embodiments, laser radiation 588 may have a wavelength that is absorbed by the polymer matrix and/or other components (e.g., fillers) of adhesive layer 530. For example, in some embodiments laser radiation 588 may have a wavelength that is in the range of 390-740 nm (e.g., 532 nm). Table 2 provides examples of conditions for marking an adhesive layer (e.g., adhesive layer 530) on a die (e.g., die 502a) using a pulsed 532 nm laser, in accordance with various embodiments. The example conditions are for marking an adhesive layer on a die using 2D multipass per cell, human readable single stroke or double stroke crossless font. These and other conditions shown in Table 2 may be adjusted to accommodate variations in die size, semiconductor material, laser energy source, adhesive layer composition/thickness, and other such factors. As such, these example conditions are not intended to be limiting.

TABLE 2

Example conditions for adhesive layer marking by thermal ablation on adhesive layer surface

| Power (W) | Frequency (kHz) | Beam Size (μm) | Pulse Energy (μJ) | Pulse-to-Pulse Overlap % | Galvo Speed (cm/sec) | Pulse duration (sec) |
|---|---|---|---|---|---|---|
| +/−10% 0.46 | 64 | +/−10% 30 | +/−10% 7.2 | +/−10% 77.5-79.2 | +/−1% 45.0 | 20-25 |

In some embodiments, laser radiation 580/680/588 may have an energy level (e.g., power level, pulse fluence or intensity) that is below a laser damage threshold for the semiconductor material of the die (e.g., semiconductor substrate 218 of die 202a). In various embodiments, the laser damage threshold for the semiconductor material and the energy level of the laser radiation may be a function of wavelength and power level. In some embodiments, the semiconductor material may have a laser damage threshold defined in terms of wavelength and power level, and laser radiation 580/680/588 may have the same wavelength and a lower power level. In other embodiments, a laser damage threshold may be expressed in terms of fluence. For example, a laser damage threshold for the semiconductor material may be a pulse fluence of 5 J/cm$^2$, and laser radiation 580/680/588 may have an energy level, expressed as pulse fluence, that is less than 5 J/cm$^2$ (e.g., 0.1-4.9 J/cm$^2$). In some embodiments, the energy level of laser radiation 580/680 may be less than the energy level of laser radiation 588. For example, in some embodiments, the energy level of laser radiation 580/680 may be in the range of 0.1-1.0 J/cm$^2$, and the energy level of laser radiation 588 may be in the range of 1.01-4.9 J/cm$^2$.

TABLE 3

Example conditions for laser scribe (ablation of semiconductor material)

| | Frequency (kHz) | Beam Size (μm) | Pulse Energy (μJ) | Pulse-to-Pulse Overlap % | Fluence (J/cm$^2$) | Pulse duration (nsec) |
|---|---|---|---|---|---|---|
| Beam 1 | 43 | 25 | 49 | 88 | 10 | 80 |
| Beam 2 | 28 | 40 | 98 | 90 | 7.8 | 120 |

In some embodiments, adhesive layer 530/630 may be transparent to a first wavelength of light (e.g., in the range of 390-740 nm), and photoreactive to a second wavelength of light. The first side of die 502a/602a may reflect, or may be opaque to, the first wavelength of light, such that the first side of die 502a/602a can be viewed/imaged by a camera. In some embodiments, adhesive layer 530/630 may be photoreactive to a second wavelength of light in the range of 10-390 nm. In other embodiments, adhesive layer 530/630 may be photoreactive to a second wavelength of light in the range of 740-3000 nm or 390-740 nm.

In various embodiments, adhesive layer 530/630 may include a plurality of nanoparticles (e.g., nanoparticles 236) configured to absorb laser energy of the second wavelength, and to convert the absorbed laser energy into heat, resulting in a laser mark (e.g., by carbonation, foaming, etc.). In other embodiments, nanoparticles dispersed within adhesive layer 530/630 may agglomerate in response to laser irradiation, providing contrast between the laser mark and surrounding adhesive material. In some embodiments, laser radiation 588 may be used to ablate/remove a portion of the outer surface of adhesive layer 530/630, and the difference in surface texture may provide contrast between the laser mark and surrounding adhesive material. In various embodiments, adhesive layer 530/630 may include a thermochromic dye configured to impart a color to the polymer matrix upon heating (e.g., during die bonding stage or by laser irradiation), and the imparted color may provide or improve contrast between a laser-irradiated/ablated area and surrounding adhesive material. Some embodiments may include both nanoparticles and thermochromic dye.

Figure 7:
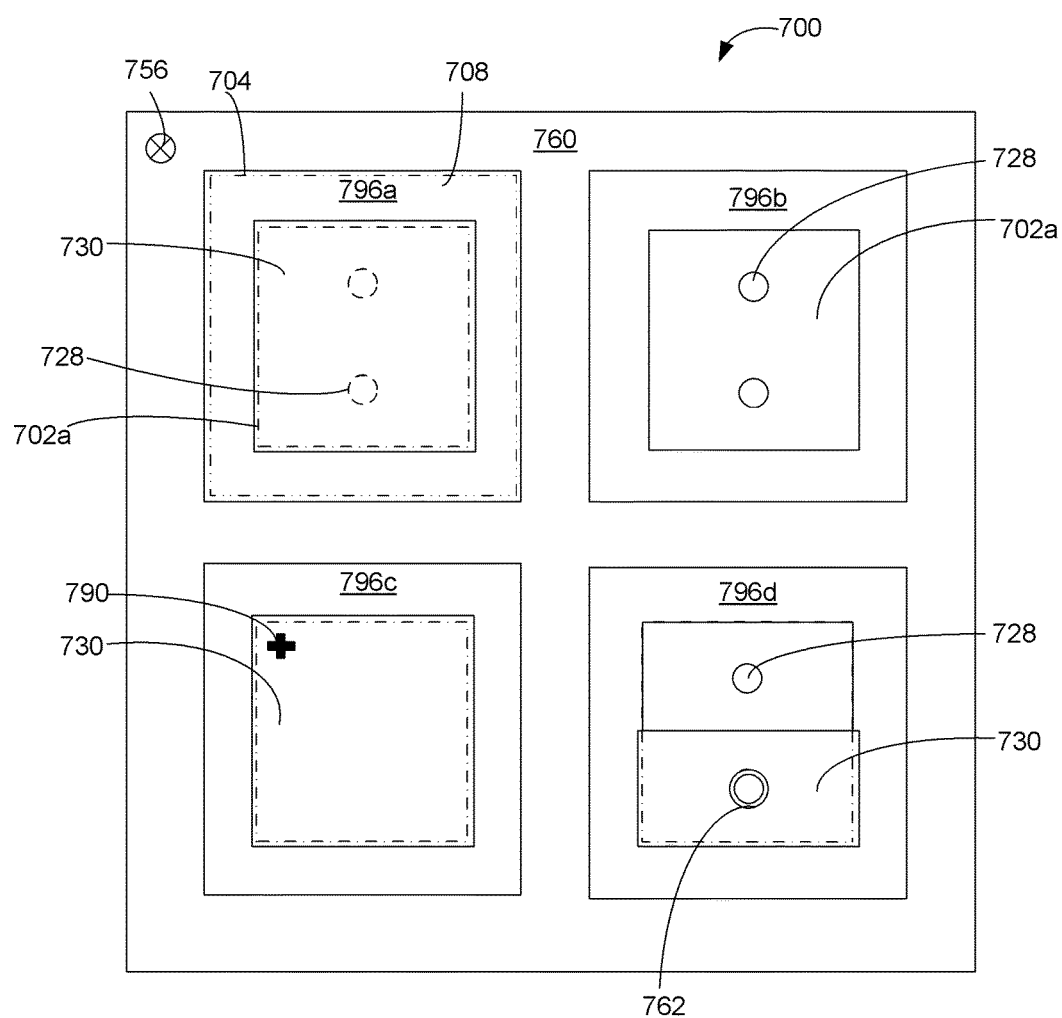
FIG. 7 schematically illustrates additional stages of package assembly fabrication, in accordance with some embodiments.

FIG. 7 depicts a BBUL strip 700 with four IC package assemblies 796a, 796b, 796c, and 796d retained on a BBUL carrier 760. IC package assemblies 796a-d may include a die 702a. In some embodiments, IC package assemblies 796a-d may also include an encapsulant 708 around die 702a and/or electrical routing features 728. In some embodiments, as depicted for IC package assembly 796a, die 702a may be positioned between a package substrate 704 (e.g., coreless package substrate 504/604) and adhesive layer 730. In some embodiments, carrier 760 may include a fiducial 756 for use in orienting/positioning various system components (e.g., lasers for via drilling, marking, etc.).

In FIG. 7, IC package assembly 796a is depicted with adhesive layer 730 disposed on die 702a (shown in broken lines), before removal or laser marking of adhesive layer 730 (package assembly 796a). IC package assembly 796b is depicted with adhesive layer 730 fully removed. IC package assembly 796c is depicted with laser mark 790 formed on or within adhesive layer 730. In some embodiments, IC package assembly 796c may lack TSVs and/or TSV pads, and adhesive layer 730 may be retained in the final package assembly. IC package assembly 796d is depicted with approximately half of adhesive layer 730 removed to reveal an electrical routing feature 728, and with a via 762 formed through the remaining half of adhesive layer 730 to expose another electrical routing feature 728.

Figure 5C:
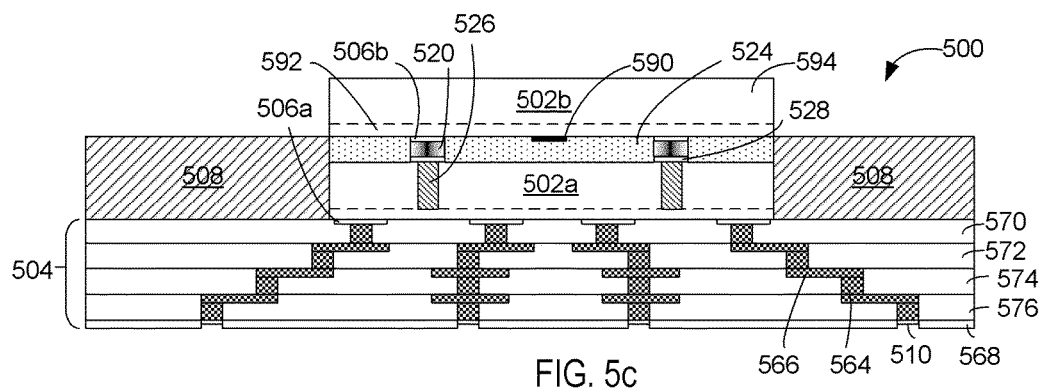
Figure 6C:
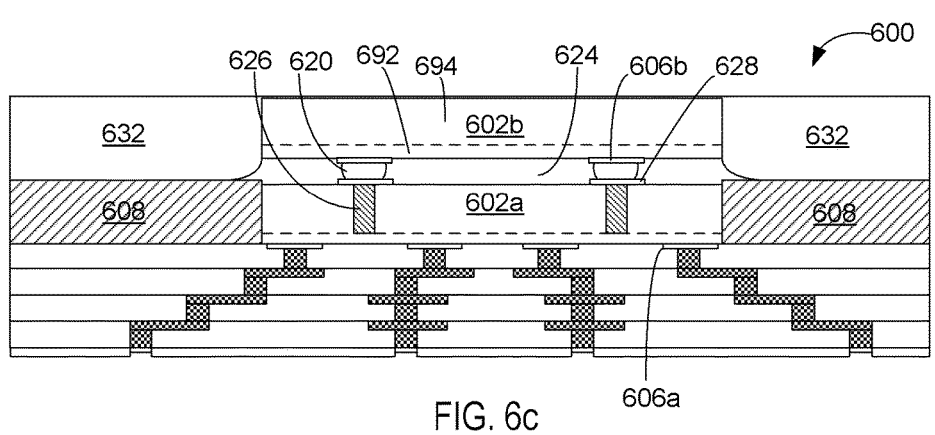

Referring again to FIG. 3, at block 323, an electronic device may be coupled with one or more electrical routing features on the first side of the die. FIGS. 5c and 6c illustrate examples of IC package assemblies 500 and 600, respectively, at a corresponding process stage. As illustrated, the electronic device may be a second die, such as second die 502b/602b. In various embodiments, second die 502b/602b may have an active layer 592/692, electrical routing features 506b/606b (e.g., die bond pads), and a semiconductor substrate 594/694 with a TSV 526/626 disposed through at least some portion thereof. In some embodiments, second die 502b/602b may be coupled to first die 502a/602a by die interconnects 520/620. In some embodiments, an encapsulant 632 may be partially or fully encased or embedded in encapsulant 632. In various embodiments, die interconnects 520/620 may be solder bumps, copper pillars, or other conductive elements. Die interconnects 520/620 may be coupled to electrical routing features 506b/606b of second die 502b/602b and to electrical routing features 528/628 of first die 502a/602a. In various embodiments, an interface layer 524/624 may be disposed between first die 502a/602a and second die 502b/602b. Interface layer 524/624 may be, for example, a layer of underfill or adhesive. In some embodiments, interface layer 524/624 may include one or more portions of adhesive layer 530/630. In various embodiments, interface layer 524/624 may include a portion of adhesive layer 530/630 with laser mark 590, and laser mark 590 may be used as a positioning reference (e.g., for positioning second die 502b/602b relative to first die 502a/602a).

Various operations are described as multiple discrete operations in turn, in a manner that is most helpful in understanding the claimed subject matter. However, the order of description should not be construed as to imply that these operations are necessarily order dependent. Embodiments of the present disclosure may be implemented into a system using any suitable hardware and/or software to configure as desired.

Figure 8:
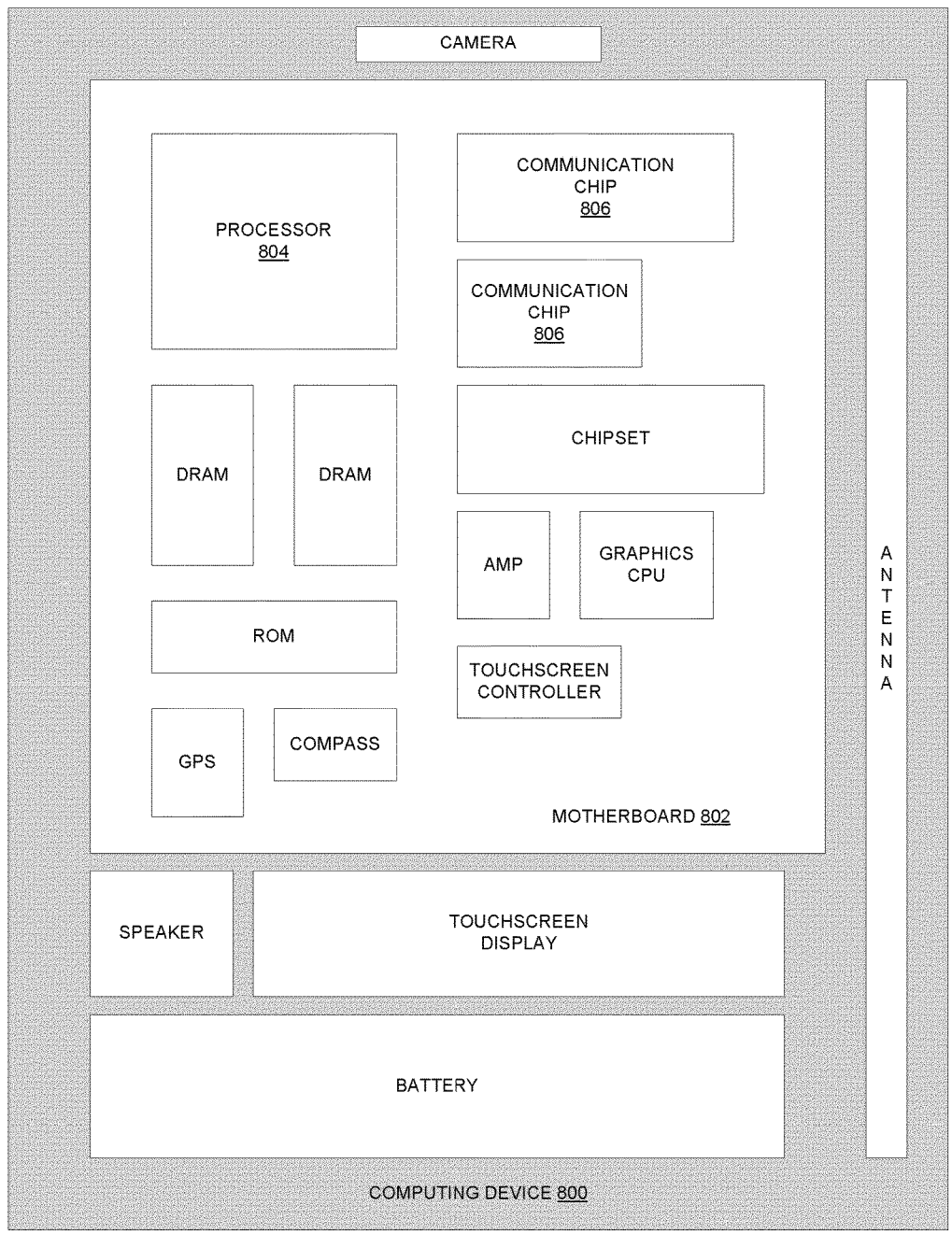
FIG. 8 schematically illustrates a computing device in accordance with various embodiments.

FIG. 8 illustrates an example computing device 800 that may include one or more components (e.g., first die 202a) having one or more TSVs, electrical routing features 228 and/or an adhesive layer 230, in accordance with various embodiments. Components are numbered in this Figure without reference to the numbering scheme of FIGS. 1-7, and like numbers do not necessarily indicate corresponding components in prior Figures.

The computing device 800 may house a board such as motherboard 802. The motherboard 802 may include a number of components, including but not limited to a processor 804 and at least one communication chip 806. The processor 804 may be physically and electrically coupled to the motherboard 802 (e.g., circuit board 122 of FIG. 1). In some implementations, the at least one communication chip 806 may also be physically and electrically coupled to the motherboard 802. In further implementations, the communication chip 806 may be part of the processor 804.

The processor 804 of the computing device 800 may include a die (e.g., first die 202a of FIG. 2) or IC package assembly (e.g., IC package assembly 500 of FIG. 5 or IC package assembly 600 of FIG. 6) having one or more TSV pads (e.g., electrical routing features 228 of FIG. 2) and/or adhesive layer 230 as described herein. For example, the processor 804 may include a die (e.g., first die 202a of FIG. 2) embodied in a package assembly (e.g., IC package assembly 500 of FIG. 5 or IC package assembly 600 of FIG. 6) that is mounted on the motherboard 802. The term "processor" may refer to any device or portion of a device that processes electronic data from registers and/or memory to transform that electronic data into other electronic data that may be stored in registers and/or memory.

The communication chip 806 may also include a die (e.g., first die 202a of FIG. 2) embodied in a package assembly (e.g., IC package assembly 500 of FIG. 5 or IC package assembly 600 of FIG. 6). In further implementations, another component (e.g., memory device or other integrated circuit device) housed within the computing device 800 may include a die (e.g., first die 202a of FIG. 2) embodied in a package assembly (e.g., IC package assembly 500 of FIG. 5 or IC package assembly 600 of FIG. 6).

Depending on its applications, computing device 800 may include other components that may or may not be physically and electrically coupled to the motherboard 802. These other components include, but are not limited to, volatile memory (e.g., dynamic random access memory, also referred to as "DRAM"), non-volatile memory (e.g., read only memory, also referred to as "ROM"), flash memory, an input/output controller, a digital signal processor (not shown), a crypto processor (not shown), a graphics processor, one or more antenna, a display (not shown), a touch screen display, a touch screen controller, a battery, an audio codec (not shown), a video codec (not shown), a global positioning system ("GPS") device, a compass, an accelerometer (not shown), a gyroscope (not shown), a speaker, a camera, and a mass storage device (such as hard disk drive, a solid state drive, compact disk ("CD"), digital versatile disk ("DVD")) (not shown), and so forth. In various embodiments, various components may be integrated with other components to form a System on Chip ("SoC"). In further embodiments, some components, such as DRAM, may be embedded in or within processor 804.

The communication chip(s) 806 may enable wired and/or wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 606 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 606 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 606 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 806 may operate in accordance with other wireless protocols in other embodiments.

The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

In various implementations, the computing device 800 may be a laptop, a netbook, a notebook, an ultrabook, a smart phone, a computing tablet, a personal digital assistant ("PDA"), an ultra mobile PC, a mobile phone, a desktop computer, a server, a printer, a scanner, a monitor, a set-top box, an entertainment control unit (e.g., a gaming console), a digital camera, a portable music player, or a digital video recorder. In further implementations, the computing device 800 may be any other electronic device that processes data.

EXAMPLES

In various embodiments, coreless substrates, as well as methods for forming package assemblies with coreless substrates and systems incorporating such package assemblies, are described herein. In various embodiments, a package assembly may include a coreless substrate comprising a first side, a second side opposite to the first side, a plurality of build-up layers (e.g., BBUL) between the first side and the second side, two or more passive device pads disposed on the first side, and an electrical routing feature disposed on the second side. In various embodiments, the coreless substrate may include an electrical path defined in the plurality of build-up layers to route electrical power between the two or more passive device pads and the electrical routing feature. In various embodiments, the electrical path may include a conductive element disposed on or within the build-up layers, and the two or more passive device pads may be conductively coupled to the conductive element.

In various embodiments, a first solder resist layer may be disposed on the first side of the coreless substrate and a second solder resist layer may be disposed on the second side of the coreless substrate. The passive device pads may be disposed within corresponding openings in the first solder resist layer, and the electrical routing feature may be disposed within a corresponding opening in the second solder resist layer. In other embodiments, a dielectric layer may be disposed on the first side of the coreless substrate and a solder resist layer may be disposed on the second side of the coreless substrate. The passive device pads may be disposed within corresponding openings in the dielectric layer, and the electrical routing feature may be disposed within a corresponding opening in the solder resist layer.

In various embodiments, the passive device pads may be capacitor pads. In various embodiments, the package assembly may further include a decoupling capacitor coupled with at least one of the capacitor pads. In various embodiments, the electrical routing feature disposed on the second side of the coreless substrate may be a first electrical routing feature and the electrical path may be a first electrical path, and the package assembly may further include a second electrical routing feature disposed on the first side of the coreless substrate, a third electrical routing feature disposed on the second side of the coreless substrate, and a second electrical path defined in the plurality of build-up layers to route electrical signals between the second electrical routing feature on the first side of the coreless substrate and the third electrical routing feature on the second side of the coreless substrate.

In various embodiments, one or more of the first and third electrical routing features may be a pad to route electrical signals to and from a die, and the package assembly may further include a die coupled to one or more of the first and third electrical routing features. In various embodiments, the decoupling capacitor may be disposed at least partially within an opening in the first side of the coreless substrate. In various embodiments, the conductive element may be connected to the passive device pads by two or more vias and a layer of metal disposed between the conductive element and the two or more vias. In various embodiments, the two or more vias may extend through at least one of the build-up layers. In various embodiments, the second electrical routing feature may be a pad to route electrical signals of one or more dies. Various embodiments may include any suitable combination of the above-described embodiments. Furthermore, some embodiments may include one or more non-transitory computer-readable media having instructions, stored thereon, that when executed result in actions of any of the above-described embodiments. Moreover, some embodiments may include apparatuses or systems having any suitable means for carrying out the various operations of the above-described embodiments.

Various embodiments may include any suitable combination of the above-described embodiments. Furthermore, some embodiments may include one or more non-transitory computer-readable media having instructions, stored thereon, that when executed result in actions of any of the above-described embodiments. Moreover, some embodiments may include apparatuses or systems having any suitable means for carrying out the various operations of the above-described embodiments.

In various embodiments, a package assembly may comprise a die with a first side and a second side opposite to the first side, the second side having one or more transistors, and an adhesive layer disposed on the first side of the die. In various embodiments, the adhesive layer may be transparent to a first wavelength of light and photoreactive to a second wavelength of light. In various embodiments, the first side of the die may be substantially opaque to the first wavelength of light. In various embodiments, the adhesive layer may be a film comprising one or more of a thermochromic dye and a phase transition material. In various embodiments, the adhesive layer may comprise a polymer matrix and a plurality of nanoparticles dispersed within the polymer matrix. In various embodiments, the nanoparticles may comprise a phase transition material. In various embodiments, the phase transition material may be vanadium dioxide.

In various embodiments, the first wavelength may be a wavelength in the range of 390-740 nm, and the second wavelength may be a wavelength in the range of 10-390 nm or 740-3000 nm. In various embodiments, the adhesive layer may be configured to exhibit a change in color or transparency in response to laser energy having the second wavelength of light. In various embodiments, the adhesive layer may further comprise a thermochromic dye. In various embodiments, the adhesive layer may be configured to exhibit a change in color or transparency upon exposure to the second wavelength of light. In various embodiments, the adhesive layer may include a laser mark.

In various embodiments, a method may comprise coupling an adhesive layer to a first side of a die composed of a semiconductor material, wherein the adhesive layer comprises a polymer matrix; coupling a plurality of build-up layers with a second side of the die opposite to the first side, wherein the second side of the die includes one or more transistors; and removing one or more portions of the adhesive layer with laser radiation, wherein the laser radiation has a wavelength in the range of 10-390 nm and wherein the laser radiation has an energy level that is below an laser damage threshold for the semiconductor material. In various embodiments, the laser radiation may have a wavelength of 240-355 nm. In various embodiments, the die may include one or more through-silicon vias (TSVs), the first side of the die may include one or more electrical routing features conductively coupled to one or more TSVs, and the one or more portions of the adhesive layer may be disposed on the electrical routing features. In various embodiments, removing one or more portions of the adhesive layer with laser radiation may include exposing the electrical routing features.

In various embodiments, the die may be a first die, and the method may further comprise coupling a second die to the one or more electrical routing features of the first die after the removing one or more portions of the adhesive layer. In various embodiments, the method may further comprise positioning a photo mask relative to the adhesive layer. In various embodiments, the photo mask may define the one or more portions of the adhesive layer. In various embodiments, said wavelength may be a first wavelength of light, and the adhesive layer may be transparent to a second wavelength of light and photoreactive to a third wavelength of light. In various embodiments, the first side of the die may be opaque to the second wavelength of light.

In various embodiments, the semiconductor material may comprise silicon. In various embodiments, the first wavelength of light may be a wavelength in the range of 10-390 nm, and the second wavelength of light may be a wavelength in the range of 390-740 nm. In various embodiments, the method may include, before coupling the plurality of build-up layers to the die, placing the die on a support with the adhesive layer disposed between the die and the support, obtaining a first image of the first side of the die on the support, matching the first image of the first side of the die to an image of the second side of the die on the support, moving the die to a bonding location, obtaining a second image of the first side of the die at the bonding location, aligning the second image of the first side of the die with a fiducial on a panel, positioning the die on the panel based at least on said aligning the second image of the first side of the die with the fiducial, and curing the adhesive layer to bond the die to the panel. In various embodiments, the adhesive layer may be disposed between the die and the panel. In various embodiments, the support may be transparent to the second wavelength of light, and the first side of the die may be detectable through the adhesive layer. In various embodiments, curing the adhesive layer may comprise irradiating the adhesive layer with a third wavelength of light in the range of 10-390 nm.

In various embodiments, the method may further comprise comparing the first and second images of the first side of the die. In various embodiments, the positioning the die on the panel may be further based at least on the comparing the first and second images of the first side of the die. In various embodiments, the method may further comprise providing one or more cameras for obtaining the first image and the second image of the first side, obtaining the image of the second side, and obtaining an image of the fiducial. In various embodiments, aligning the second image with the fiducial may comprise matching the second image of the first side of the die to the image of the fiducial. In various embodiments, positioning the die may comprise positioning the die on the panel based at least on the second image of the first side of the die and the image of the fiducial. In various embodiments, curing the adhesive layer may comprise heating one or more of the die, the adhesive layer, and the panel to at least 70° C. In various embodiments, the method may further include removing the panel from the adhesive layer. In various embodiments, the one or more portions of the adhesive layer may be a first one or more portions of the adhesive layer, and the method may further comprise selectively exposing a second one or more portions of the adhesive layer to the third wavelength of light to form a laser mark. In various embodiments, the adhesive layer may comprise one or more of a thermochromic dye and a phase transition material. In various embodiments, the phase transition material may include a plurality of nanoparticles comprising a transition metal oxide. In various embodiments, the transition metal oxide may be vanadium dioxide. In various embodiments, the adhesive layer may comprise a thermochromic dye configured to exhibit a color change in response to an increase in temperature. In various embodiments, the adhesive layer may comprise two or more of a thermochromic dye and a plurality of nanoparticles.

In various embodiments, a system may comprise a printed circuit board (PCB) and a package assembly coupled with the PCB via electrical routing features disposed on an outer surface of the package assembly. In various embodiments, the package assembly may comprise a substrate comprising a plurality of build-up layers, a die with a first side and a second side opposite to the first side, the second side having one or more transistors, an adhesive layer disposed on the first side of the die, and an electrical path defined in the plurality of build-up layers to route electrical signals between the die and the PCB. In various embodiments, the adhesive layer is transparent to a first wavelength of light and photoreactive to a second wavelength of light. In various embodiments, the die may be substantially opaque to the first wavelength of light. In various embodiments, the die may be a first die. In various embodiments, the first wavelength of light may be a wavelength in the range of 390-740 nm, and the second wavelength of light may be a wavelength in the range of 10-390 or 740-3000 nm. In various embodiments, the package assembly may further comprise a second die coupled to the first die.

In various embodiments, the adhesive layer may be a film comprising one or more of a thermochromic dye and a plurality of nanoparticles configured to absorb laser energy having the second wavelength of light. In various embodiments, the adhesive layer may comprise a polymer matrix and a plurality of nanoparticles dispersed within the polymer matrix. In various embodiments, the nanoparticles may comprise a phase transition material. In various embodiments, the adhesive layer may be configured to exhibit a change in color or transparency upon exposure to the second wavelength of light. In various embodiments, the phase transition material may be a transition metal oxide. In various embodiments, the transition metal oxide may be vanadium dioxide. In various embodiments, the adhesive layer may further comprise a thermochromic dye.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A method, comprising:
   removing, by a die bonding head, a die from a support, the die having an adhesive layer on a side of the die, wherein the adhesive layer is located on an opposite side of the die from the die bonding head when removed, and wherein the die is composed of a semiconductor material and the adhesive layer comprises a polymer matrix;
   moving, by the die bonding head, the die to a bonding site located above a panel;
   positioning, by the die bonding head, the die on the panel with the adhesive layer against the panel, the die positioned based on a comparison of an image of the side of the die with an image of the panel, wherein the side of the die is detectable through the adhesive layer, and wherein the image of the panel captures a fiducial on the panel used for the positioning of the die on the panel;
   curing, by the die bonding head, the adhesive layer to bond the die to the panel; and
   releasing, by the die bonding head, the die to allow for coupling of a plurality of build-up layers to the die and a removal of one or more portions of the adhesive layer via laser radiation.

2. The method of claim 1, further comprising preheating, by the die bonding head, the die prior to positioning the die on the panel.

3. The method of claim 1, wherein curing the adhesive layer includes heating the adhesive layer to a bonding temperature.

4. The method of claim 3, wherein the bonding temperature is between 50 and 200 degrees Celsius.

5. The method of claim 1, wherein curing the adhesive layer includes curing the adhesive layer with laser energy.

6. The method of claim 1, wherein the side of the die is a first side of the die, and wherein the method further comprises:
capturing an image of a second side of the die, the second side of the die being opposite to the first side of the die; and
identifying a fiducial on the second side of the die based on the image of the second side of the die, wherein removing the die from the support includes aligning the die on the die bonding head based on a location of the fiducial.

7. The method of claim 1, further comprising:
capturing the image of the side of the die; and
identifying a fiducial on the side of the die based on the image of the side of the die, wherein the die is positioned on the panel based on a location of the fiducial on the side of the die.

8. The method of claim 7, wherein the image of the side of the die is a second image of the side of the die, wherein the second image of the side of the die is captured after the die is removed from the support, and wherein the method further comprises:
capturing a first image of the side of the die prior to removing the die from the support; and
comparing the first image with the second image to determine a location of the die on the die bonding head, wherein positioning the die on the panel is at least partially based on the location of the die on the die bonding head.

9. The method of claim 7, further comprising:
capturing the image of the panel; and
identifying the fiducial on the panel based on the image of the panel.

10. The method of claim 1, further comprising:
capturing the image of the side of the die; and
identifying an electrical routing feature on the side of the die or outer contours of the die based on the image of the side of the die, wherein the die is positioned on the panel based on the location of the electrical routing feature on the side of the die or the outer contours of the die.

11. The method of claim 10, further comprising:
capturing the image of the panel; and
identifying the fiducial on the panel based on the image of the panel.

12. One or more non-transitory computer-readable media having instructions stored thereon, wherein the instructions, in response to execution by a die bonder, cause the die bonder to:
remove, by a die bonding head of the die bonder, a die from a support, the die having an adhesive layer on a side of the die, wherein the adhesive layer is located on an opposite side of the die from the die bonding head when removed, and wherein the die is composed of a semiconductor material and the adhesive layer comprises a polymer matrix;
move, by the die bonding head, the die to a bonding site located above a panel;
position, by the die bonding head, the die on the panel with the adhesive layer against the panel, the die positioned based on a comparison of an image of the side of the die with an image of the panel, wherein the side of the die is detectable through the adhesive layer, and wherein the image of the panel captures a fiducial on the panel used to position the die on the panel;
cure, by the die bonding head, the adhesive layer to bond the die to the panel; and
release, by the die bonding head, from the die to allow for coupling of a plurality of build-up layers to the die and a removal of one or more portions of the adhesive layer via laser radiation.

13. The one or more non-transitory computer-readable media of claim 12, wherein the instructions, in response to execution by the die bonder, further cause the die bonder to preheat, by the die bonding head, the die prior to positioning the die on the panel.

14. The one or more non-transitory computer-readable media of claim 12, wherein to cure the adhesive layer includes to heat the adhesive layer to a bonding temperature.

15. The one or more non-transitory computer-readable media of claim 14, wherein the bonding temperature is between 50 and 200 degrees Celsius.

16. The one or more non-transitory computer-readable media of claim 12, wherein to cure the adhesive layer includes to cure the adhesive layer with laser energy.

17. The one or more non-transitory computer-readable media of claim 12, wherein the side of the die is a first side of the die, and wherein the instructions, in response to execution by the die bonder, further cause the die bonder to: capture an image of a second side of the die, the second side of the die being opposite to the first side of the die; and identify a fiducial on the second side of the die based on the image of the second side of the die, wherein to remove the die from the support includes to align the die on the die bonding head based on a location of the fiducial on the second side of the die.

18. The one or more non-transitory computer-readable media of claim 12, wherein the instructions, in response to execution by the die bonder, further cause the die bonder to: capture the image of the side of the die; and identify a fiducial on the side of the die based on the image of the side of the die, wherein the die is positioned on the panel based on a location of the fiducial on the side of the die.

19. The one or more non-transitory computer-readable media of claim 18, wherein the image of the side of the die is a second image of the side of the die, wherein the second image of the side of the die is captured after the die is removed from the support, and wherein the instructions, in response to execution by the die bonder, further cause the die bonder to: capture a first image of the side of the die prior to removal of the die from the support; and compare the first image with the second image to determine a location of the die on the die bonding head, wherein the die is positioned on the panel based at least partially on the location of the die on the die bonding head.

20. The one or more non-transitory computer-readable media of claim 18, wherein the instructions, in response to execution by the die bonder, further cause the die bonder to: capture the image of the panel; and identify the fiducial on the panel based on the image of the panel.

* * * * *